US012672526B2

(12) United States Patent
Bertrand et al.

(10) Patent No.: US 12,672,526 B2
(45) Date of Patent: Jun. 30, 2026

(54) METHOD FOR MANUFACTURING A SEMICONDUCTOR-ON-INSULATOR SUBSTRATE FOR RADIOFREQUENCY APPLICATIONS

(71) Applicant: Soitec, Bernin (FR)

(72) Inventors: Isabelle Bertrand, Bernin (FR); Walter Schwarzenbach, Bernin (FR); Frédéric Allibert, Bernin (FR)

(73) Assignee: Soitec, Bernin (FR)

( * ) Notice: Subject to any disclaimer, the term of this patent is extended or adjusted under 35 U.S.C. 154(b) by 586 days.

(21) Appl. No.: 17/998,833

(22) PCT Filed: May 18, 2021

(86) PCT No.: PCT/FR2021/050870
§ 371 (c)(1),
(2) Date: Nov. 15, 2022

(87) PCT Pub. No.: WO2021/234277
PCT Pub. Date: Nov. 25, 2021

(65) Prior Publication Data
US 2023/0207382 A1 Jun. 29, 2023

(30) Foreign Application Priority Data
May 18, 2020 (FR) ...................................... 2004971

(51) Int. Cl.
*H10P 90/00* (2026.01)
*H10W 10/10* (2026.01)

(52) U.S. Cl.
CPC ....... *H10P 90/1916* (2026.01); *H10W 10/181* (2026.01)

(58) Field of Classification Search
CPC ......... H01L 21/76254; H01L 21/02032; H10P 90/1916; H10P 90/16; H10W 10/181
See application file for complete search history.

(56) References Cited

U.S. PATENT DOCUMENTS

2008/0211061 A1* 9/2008 Atwater, Jr. ........ H01L 21/2007
257/E29.089
2010/0297828 A1* 11/2010 Maleville .......... H01L 21/02079
257/E21.568
(Continued)

FOREIGN PATENT DOCUMENTS

| CN | 101933132 A | 12/2010 |
| CN | 101989567 A | 3/2011 |

(Continued)

OTHER PUBLICATIONS

Chinese First Office Action for Application No. 202180034312.2 dated Apr. 27, 2025, 7 pages.
(Continued)

*Primary Examiner* — William B Partridge
*Assistant Examiner* — Erik A. Anderson
(74) *Attorney, Agent, or Firm* — TraskBritt

(57) ABSTRACT

A method for fabricating a semiconductor-on-insulator substrate for radiofrequency applications, comprises:
forming a donor substrate through epitaxial growth of an undoped semiconductor layer on a p-doped semiconductor seed substrate;
forming an electrically insulating layer on the undoped epitaxial semiconductor,
implanting ion species through the electrically insulating layer, so as to form, in the undoped epitaxial semiconductor layer, a weakened area defining a semiconductor thin layer to be transferred,
providing a semiconductor carrier substrate having an electrical resistivity greater than or equal to 500 Ω·cm,
bonding the donor substrate to the carrier substrate via the electrically insulating layer, and
(Continued)

detaching the donor substrate along the weakened area of embrittlement so as to transfer the semiconductor thin layer from the donor substrate to the carrier substrate.

15 Claims, 6 Drawing Sheets

(56) References Cited

U.S. PATENT DOCUMENTS

| | | | |
|---|---|---|---|
| 2010/0314722 A1* | 12/2010 | Ishizuka | H10D 30/6758 |
| | | | 257/E29.004 |
| 2011/0034006 A1* | 2/2011 | Maleville | H01L 21/76254 |
| | | | 257/E21.088 |
| 2012/0086051 A1 | 4/2012 | Wang et al. | |
| 2012/0329243 A1* | 12/2012 | Letertre | H01L 21/76254 |
| | | | 438/758 |
| 2018/0130883 A1* | 5/2018 | Hardy | H01L 21/3081 |
| 2018/0334757 A1* | 11/2018 | Kubota | H01L 21/02529 |
| 2019/0058031 A1* | 2/2019 | Figuet | H01L 21/02447 |
| 2020/0098907 A1* | 3/2020 | Liu | H10D 30/4735 |
| 2020/0127041 A1* | 4/2020 | Schwarzenbach | |
| | | | H01L 21/76254 |
| 2021/0305097 A1* | 9/2021 | Reboh | H10D 84/038 |

FOREIGN PATENT DOCUMENTS

| | | |
|---|---|---|
| CN | 103946970 A | 7/2014 |
| CN | 108028170 A | 5/2018 |
| EP | 3358600 B1 | 8/2022 |
| FR | 3063834 A1 | 9/2018 |
| WO | 2017/198687 A1 | 11/2017 |

OTHER PUBLICATIONS

Taiwanese Search Report and Opinion for Application No. 110117327 dated Jun. 11, 2024, 8 pages with machine translation.

Singapore Written Opinion for Application No. 11202254873Y dated Nov. 5, 2025, 6 pages.

Graupner, Robert Kurt, A Study of Oxygen Precipitation in Heavily Doped Silicon, Dissertations and Theses, Portland State University, (1989), Paper 1218, 132 pages.

International Search Report for International Application No. PCT/FR2021/050870 dated Aug. 25, 2022, 2 pages.

International Written Opinion for International Application No. PCT/FR2021/050870 dated Aug. 25, 2022, 6 pages.

* cited by examiner

METHOD FOR MANUFACTURING A SEMICONDUCTOR-ON-INSULATOR SUBSTRATE FOR RADIOFREQUENCY APPLICATIONS

CROSS-REFERENCE TO RELATED APPLICATIONS

This application is a national phase entry under 35 U.S.C. § 371 of International Patent Application PCT/FR2021/050870, filed May 18, 2021, designating the United States of America and published as International Patent Publication WO 2021/234277 A1 on Nov. 25, 2021, which claims the benefit under Article 8 of the Patent Cooperation Treaty to French Patent Application Serial No. 2004971, filed May 18, 2020.

TECHNICAL FIELD

The present disclosure relates to a process for fabricating a semiconductor-on-insulator substrate for radiofrequency applications.

BACKGROUND

Radiofrequency electronic components formed in or on semiconductor substrates are particularly sensitive to attenuation phenomena caused by the properties of the substrates.

For this reason, use is usually made of semiconductor substrates, in particular, bulk silicon substrates, having a high electrical resistivity, that is to say greater than 500 Ω·cm.

Moreover, FDSOI (acronym for the term "fully depleted semiconductor on insulator") semiconductor-on-insulator substrates appear to be beneficial alternatives to semiconductor substrates. FDSOI substrates comprise, in succession, a carrier substrate, an electrically insulating layer and a semiconductor thin layer in or on which electronic components are able to be fabricated. In an FDSOI substrate, the thickness of the semiconductor layer is thin enough to allow complete depletion of the conduction channel of a transistor formed in the layer. Such a layer typically has a thickness of a few tens of nanometers. The electrically insulating layer, which generally comprises an oxide, is also commonly called BOX (acronym for the term "Buried OXide"). The process for fabricating FDSOI substrates aims to achieve great accuracy with regard to the thickness of the semiconductor layer and of the electrically insulating layer as well as great uniformity of these thicknesses, both within a substrate and from one substrate to another within the same fabrication batch.

It could therefore be beneficial, for radiofrequency applications, to form FDSOI substrates with carrier substrates comprising a semiconductor material with high electrical resistivity.

The process for fabricating an FDSOI substrate is shown schematically in FIGS. 1A to 1C. This process implements a layer transfer from a donor substrate to a carrier substrate, also known by the process name Smart Cut™.

With reference to FIG. 1A, provision is made for a donor substrate 1, for example, made of silicon, covered with an electrically insulating layer 10, for example, made of silicon oxide ($SiO_2$).

As shown schematically by the arrows, an ion species implantation is performed, using, for example, hydrogen and/or helium ions, through the electrically insulating layer 10, so as to form a weakened area 11 in the donor substrate 1. The weakened area 11 defines a thin layer 12 to be transferred.

With reference to FIG. 1B, the donor substrate 1 thus implanted is bonded to a carrier substrate 2 by way of the electrically insulating layer, which then performs the function of a bonding layer. The carrier substrate 2 may advantageously be a semiconductor substrate, for example, made of silicon, with high electrical resistivity.

With reference to FIG. 1C, the donor substrate 1 is detached along the weakened area 11, resulting in the thin layer 12 being transferred to the carrier substrate 2.

A finishing treatment is then performed on the transferred layer, so as to rectify defects linked to the implantation and to smooth the free surface of the layer.

A semiconductor-on-insulator substrate is thus obtained.

In the case of an FDSOI substrate, the target thickness for the transferred semiconductor layer is between 4 nm and 100 nm, with a maximum variation of ±5 Å with respect to the target value, within each substrate and between the various substrates fabricated using the process. Such uniformity and a very low roughness of the transferred layer may be achieved using a finishing process called "batch anneal," which is a lengthy, high-temperature smoothing process that is advantageously carried out in a furnace in order to treat a plurality of substrates at the same time. Such a "batch anneal" is typically implemented at a temperature between 1150 and 1200° C. for a duration of several minutes, generally greater than 15 minutes. This smoothing allows the transferred semiconductor layer to be brought to a level of surface roughness that is compatible with the subsequent fabrication of transistors.

However, this process is detrimental for radiofrequency applications, in particular, for extremely high-frequency applications, that is to say in a frequency band between 30 and 300 GHz. This frequency band is also called "mmWave."

Specifically, the carrier substrate has a high electrical resistivity and is thereby weakly doped. The carrier substrate is thus generally substantially less doped (for example, boron-doped) than the donor substrate, in other words less doped than the transferred thin layer.

However, due to this difference in doping level between the transferred thin layer and the carrier substrate, under the effect of the high thermal budget of the finishing treatment of the FDSOI substrate and, to a lesser extent, under the effect of the thermal budget of the bonding and/or the detachment, the boron atoms diffuse through the electrically insulating layer into the carrier substrate, leading to a reduction in electrical resistivity in a surface portion extending from the electrically insulating layer.

Now, even if this surface portion extends only a few micrometers deep into the carrier substrate, the drop in electrical resistivity in this area leads to significant electrical losses for mmWave waves.

BRIEF SUMMARY

One aim of the present disclosure is to define a process for fabricating an FDSOI semiconductor-on-insulator substrate suitable for radiofrequency applications, making it possible to keep a high resistivity of the carrier substrate even close to the electrically insulating layer.

For this reason, the present disclosure proposes a process for fabricating a semiconductor-on-insulator substrate for radiofrequency applications, comprising the following steps:

forming a donor substrate through epitaxial growth of an undoped semiconductor layer on a p-doped semiconductor seed substrate, forming an electrically insulating layer on the undoped epitaxial semiconductor layer, implanting ion species through the electrically insulating layer, so as to form, in the undoped epitaxial semiconductor layer, a weakened area defining a semiconductor thin layer to be transferred, providing a semiconductor carrier substrate having an electrical resistivity greater than or equal to 500 Ω·cm, bonding the donor substrate to the carrier substrate via the electrically insulating layer, and detaching the donor substrate along the weakened area so as to transfer the semiconductor thin layer from the donor substrate to the carrier substrate.

By virtue of this process, the dopants of the seed substrate are kept far enough away from the bonding interface by the epitaxial layer and the electrically insulating layer (which do not contain any such dopants) that they are not able to diffuse into the carrier substrate. The electrical resistivity of the carrier substrate is thus not affected, even in its portion close to the bonding interface.

In some embodiments, the undoped epitaxial semiconductor layer has a thickness between 10 and 1000 nm.

In some embodiments, the seed substrate is boron-doped.

In some embodiments, forming the electrically insulating layer comprises thermally oxidizing the material of the undoped epitaxial semiconductor layer.

In some embodiments, forming the donor substrate comprises forming, between the seed substrate and the undoped epitaxial semiconductor layer, an intermediate layer made of a material different from the material of the epitaxial semiconductor layer, chosen so as to allow selective etching of the undoped epitaxial layer with respect to the intermediate layer.

In some embodiments, the material of the undoped epitaxial layer is silicon and the material of the intermediate layer is silicon-germanium with a germanium content less than or equal to 30%.

In some embodiments, the process comprises, after the detachment, selectively etching the remainder of the undoped epitaxial semiconductor layer with respect to the intermediate layer and then selectively etching the intermediate layer with respect to the seed substrate, and forming a new donor substrate by successively forming, on the seed substrate, a new intermediate layer and a new undoped epitaxial layer.

In some embodiments, the electrically insulating layer has a thickness between 10 and 150 nm.

In some embodiments, the transferred semiconductor layer has a thickness between 4 and 300 nm.

BRIEF DESCRIPTION OF THE DRAWINGS

Further features and advantages will become apparent from the following detailed description, with reference to the accompanying drawings, in which.

To make the figures clearer, the various layers are not necessarily shown to scale.

Reference signs that are identical from one figure to the next denote elements that are similar or at the very least perform the same function.

DETAILED DESCRIPTION

The fabrication process avoids the diffusion of dopants from the donor substrate into the carrier substrate by forming an undoped semiconductor epitaxial layer on a p-doped seed substrate conventionally used in the Smart Cut™ process, the assembly comprising the seed substrate and the epitaxial layer forming the donor substrate, which is intended to receive an ion species implantation and to be bonded to the carrier substrate.

The thickness of the epitaxial layer is greater than the thickness of the semiconductor layer to be transferred.

Thus, over the course of the process for fabricating the FDSOI substrate, the seed substrate that contains the dopants is separated from the carrier substrate by the epitaxial layer and by the electrically insulating layer, which ensures bonding between the donor substrate and the carrier substrate, which does not contain any such dopants.

Figure 1A:
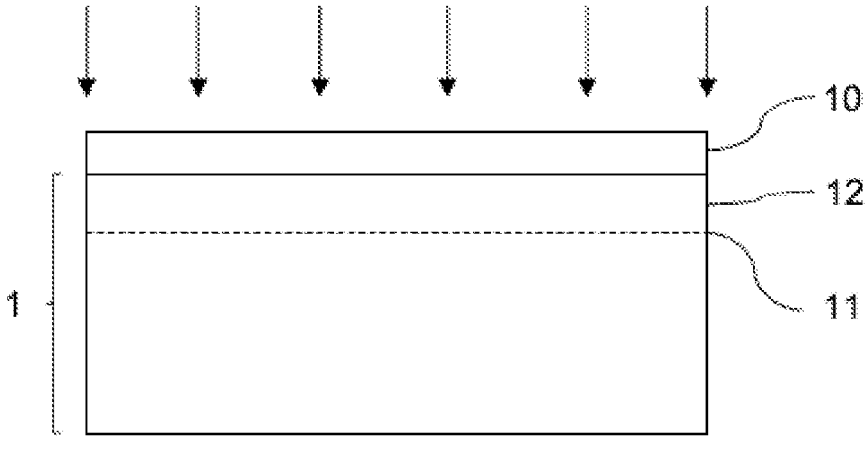
FIG. 1A is a schematic sectional view of the implantation of atomic species through an electrically insulating layer arranged on a donor substrate.
Figure 1B:
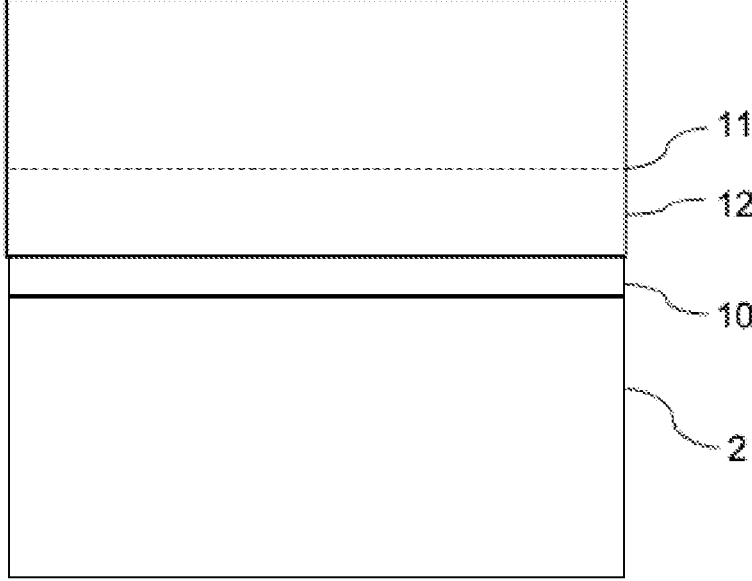
FIG. 1B is a schematic sectional view of the bonding of the donor substrate that has undergone the implantation in FIG. 1A to a carrier substrate.
Figure 1C:
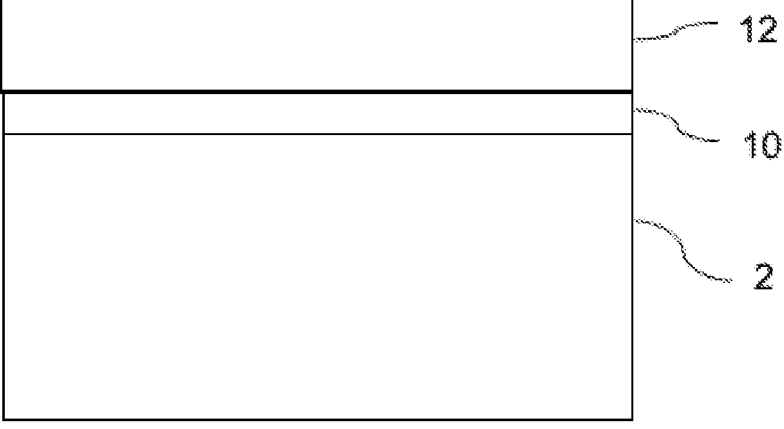
FIG. 1C is a schematic sectional view of the transfer of a thin layer from the donor substrate to the carrier substrate of FIG. 1B.
Figure 2:
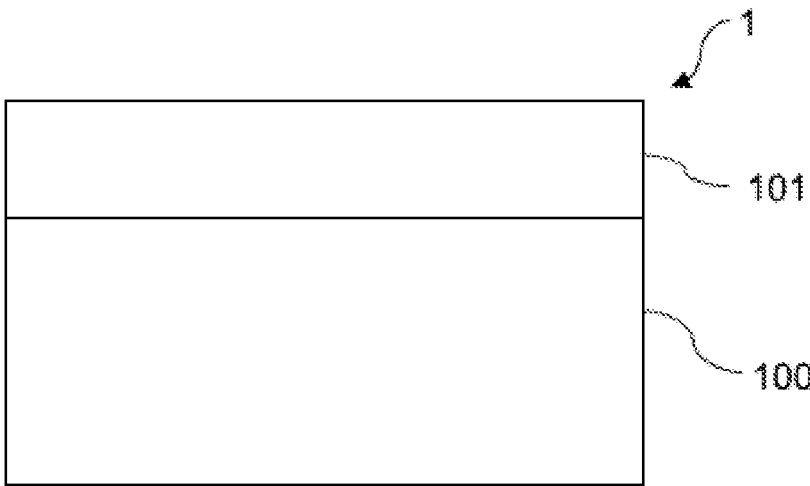
FIG. 2 is a schematic sectional view of the formation of a donor substrate by growing an undoped epitaxial layer on a doped seed substrate.

FIG. 2 illustrates the formation of the donor substrate 1.

The donor substrate 1 comprises a seed substrate 100, made of a monocrystalline semiconductor material, such as silicon.

The seed substrate 100 has a concentration of p-type dopants, for example, of boron, of the order of $10E^{15}$ at/cm³. Such a substrate is specifically a standard in the microelectronics industry and is available at a cost-effective price.

A monocrystalline semiconductor epitaxial layer 101 is grown epitaxially on the seed substrate 100. The epitaxy conditions are chosen so as to avoid or at the very least minimize the presence of dopants in the layer 101. In any case, the concentration of dopants in the layer 101 is lower than the content of dopants in the seed substrate 100.

Preferably, the concentration of dopants in the layer 101 is lower than 1E14 at/cm³, and if possible of the order of 1E13 at/cm³.

To ensure a good crystalline quality of the layer 101, the material of the layer advantageously has a lattice parameter close to that of the seed substrate 100, the seed substrate serving as seed for the growth of the monocrystalline layer 101.

In some embodiments, the epitaxial layer is formed of the same material (free from dopants) as the seed substrate.

The undoped epitaxial semiconductor layer has a thickness between 10 and 1000 nm, greater than the thickness of the layer to be transferred using the Smart Cut™ process.

Forming such a composite donor substrate makes it possible to limit the presence of dopants in the layer to be transferred from the donor substrate to the carrier substrate, for a cost lower than that of an undoped bulk substrate. Specifically, insofar as it is the epitaxy that defines the crystalline quality of the layer to be transferred, it is possible to use a seed substrate of quality lower than that of donor substrates that are traditionally used.

Figure 3:
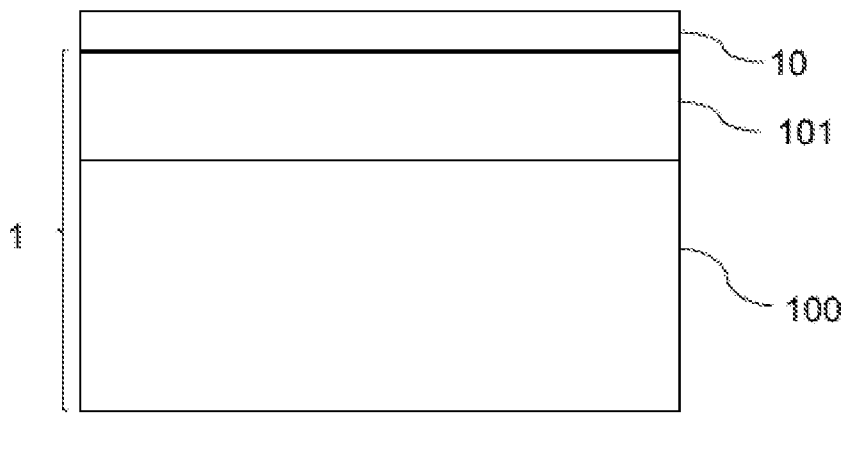
FIG. 3 is a schematic sectional view of the formation of an electrically insulating layer on the epitaxial layer of FIG. 2.

With reference to FIG. 3, an electrically insulating layer 10 is formed on the undoped epitaxial semiconductor layer 101. The layer 10 makes it possible, in particular, to minimize direct paths of the atomic species during implantation (phenomenon known by the term "channelling"). Moreover, the layer 10 performs the function of a bonding layer between the donor substrate and the carrier substrate.

Particularly advantageously, the layer 10 is an oxide layer, so as to ensure good-quality bonding with the semiconductor material of the carrier substrate.

The layer 10 may be formed, in particular, through thermal oxidation of the undoped epitaxial layer 101. The layer 10 is thereby substantially free from dopants.

Figure 4:
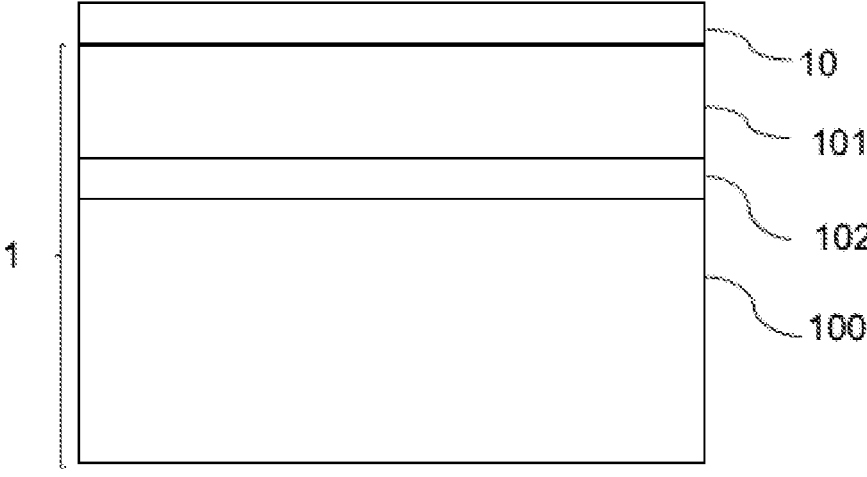
FIG. 4 is a schematic sectional view of an alternative to FIGS. 2 and 3, comprising growing an intermediate layer between the seed substrate and the undoped layer.

As an alternative, illustrated in FIG. 4, the undoped epitaxial layer 101 is not formed directly on the seed substrate 100, but on an intermediate layer 102 formed beforehand on the seed substrate 100.

The intermediate layer 102 is a monocrystalline semiconductor layer formed of a material different from that of the epitaxial layer. The material is advantageously chosen so as to allow selective etching of the undoped epitaxial layer 101 with respect to the intermediate layer 102, while at the same time having a lattice parameter close enough to that of the layer 101 to allow the growth of the layer 101 with a good crystalline quality.

For example, if the material of the undoped epitaxial layer 101 is silicon, the material of the intermediate layer 102 is advantageously silicon-germanium with a germanium content less than or equal to 30%.

The intermediate layer 102 may be formed epitaxially on the seed substrate 100. Preferably, the material of the intermediate layer also has a lattice parameter close enough to that of the seed substrate 100 to allow the growth of the intermediate layer 102 with a good crystalline quality.

The thickness of the intermediate layer 102 may be between 10 and 100 nm.

The electrically insulating layer 10 described above with reference to FIG. 3 is formed on the undoped epitaxial semiconductor layer 101.

The following figures show the embodiment of the donor substrate including the intermediate layer 102, but it goes without saying that the description also applies to the embodiment in which the donor substrate comprises the epitaxial layer formed directly on the seed substrate, as illustrated in FIG. 3.

Figure 5:
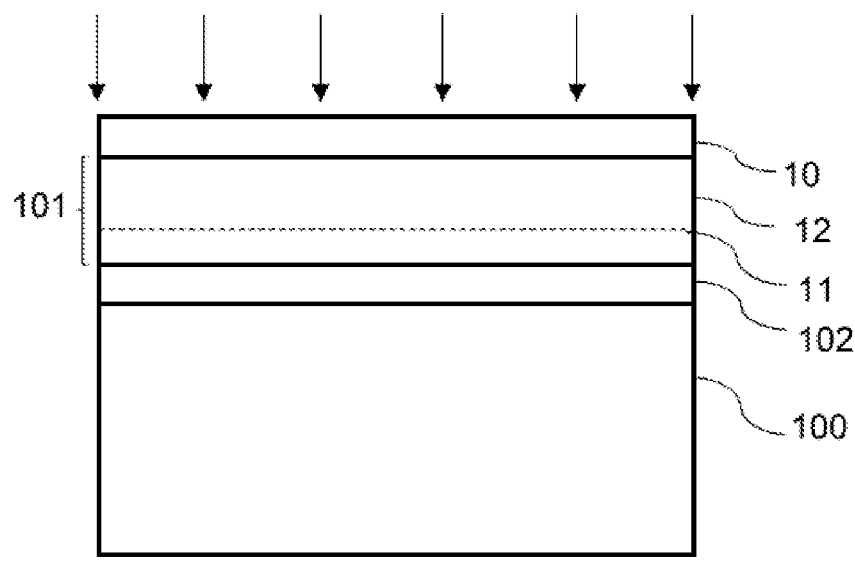
FIG. 5 is a schematic sectional view of the implantation of ion species into the donor substrate of FIG. 4 through the electrically insulating layer.

With reference to FIG. 5, ion species are implanted (shown schematically by the arrows) into the donor substrate through the electrically insulating layer 10.

The implanted species typically comprise hydrogen and/or helium.

The dose and the energy of the implanted species are chosen so as to form a weakened area 11 situated in the undoped epitaxial layer 101. The weakened area 11 defines, in the layer 101, a thin layer to be transferred 12. The thickness of the layer to be transferred 12 may be between 4 and 100 nm.

Figure 6:
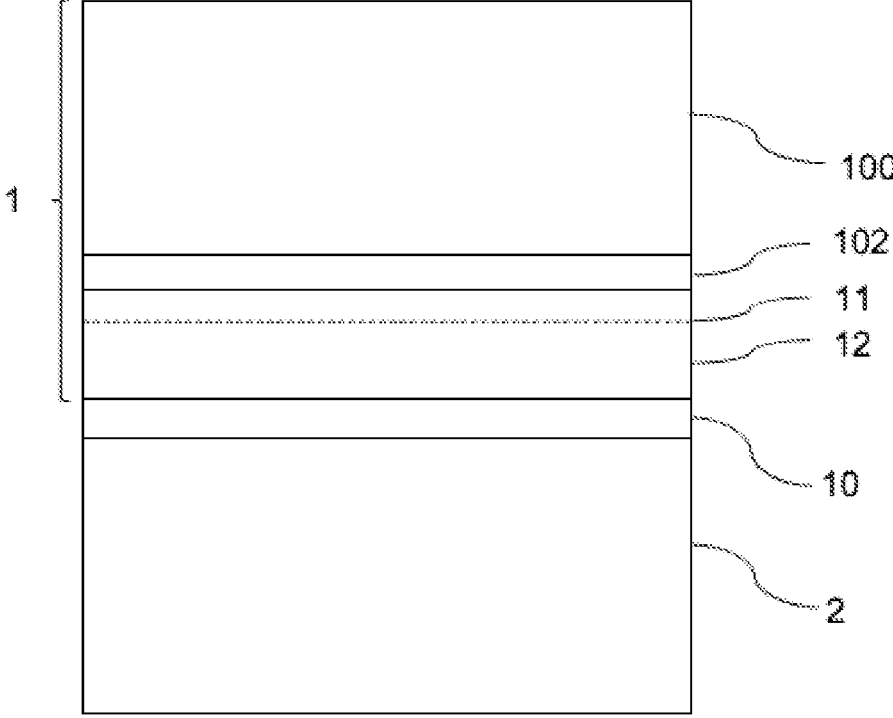
FIG. 6 is a schematic sectional view of the bonding of the donor substrate of FIG. 5 and of a carrier substrate with high electrical resistivity.

With reference to FIG. 6, the donor substrate 1 is bonded to a carrier substrate 2 by way of the electrically insulating layer 10.

The carrier substrate 2 is a semiconductor substrate, for example, made of silicon, having a high electrical resistivity, for example, greater than 500 Ω·m, preferably greater than or equal to 1000 Ω·cm.

Particularly advantageously, the carrier substrate is a silicon substrate having a high interstitial oxygen content, that is to say a content greater than 20 old ppma (for the definition of the unit old ppma, reference may be made to the dissertation by Robert Kurt Graupner, "A Study of Oxygen Precipitation in Heavily Doped Silicon" (1989), Dissertations and Theses, Paper 1218). Such a substrate is generally denoted using the abbreviation "HiOi." The interstitial oxygen atoms are liable to precipitate under the effect of a thermal treatment, so as to form a large number of defects, called "Bulk Micro Defects" (BMD), formed by oxygen precipitates, which block the dislocations generated during high-temperature thermal treatments, this being advantageous for preserving the crystalline quality of the carrier substrate.

In practice, to use such an HiOi substrate to fabricate an FDSOI substrate, the process comprises, prior to the bonding, a step of thermally treating the carrier substrate at a temperature sufficient to cause the interstitial oxygen to precipitate and form the BMD. Such a thermal treatment may typically be performed in a thermal cycle reaching a temperature of the order of 1000° C. lasting 12 hours.

Moreover, an HiOi substrate generally comprises a large number of crystalline defects called COPs (acronym for the term "crystal originated particles"), which are undesirable in an FDSOI substrate. Advantageously, the fabrication process therefore comprises a "depletion" thermal treatment, aimed at making oxygen diffuse outside the carrier substrate. In practice, this treatment may be performed at the same time as the thermal treatment for precipitating interstitial oxygen, as long as the surface of the carrier substrate is free, that is to say not oxidized, so as to allow oxygen to diffuse outside the substrate. In this case, this precipitation/diffusion thermal treatment should be performed prior to the formation of the electrically insulating layer on the carrier substrate.

As an alternative, a person skilled in the art may choose, for the carrier substrate, a silicon substrate having a low or middling interstitial oxygen content, that is to say a content less than 10 old ppma, respectively between 10 and 20 old ppma. Such a substrate is generally denoted using the abbreviation "LowOi," respectively "MidOi." In this case, the abovementioned precipitation and/or diffusion thermal treatments are not necessary.

The bonding may possibly be supplemented by a process of preparing the electrically insulating surface, for example, using an oxygen plasma.

Figure 7:
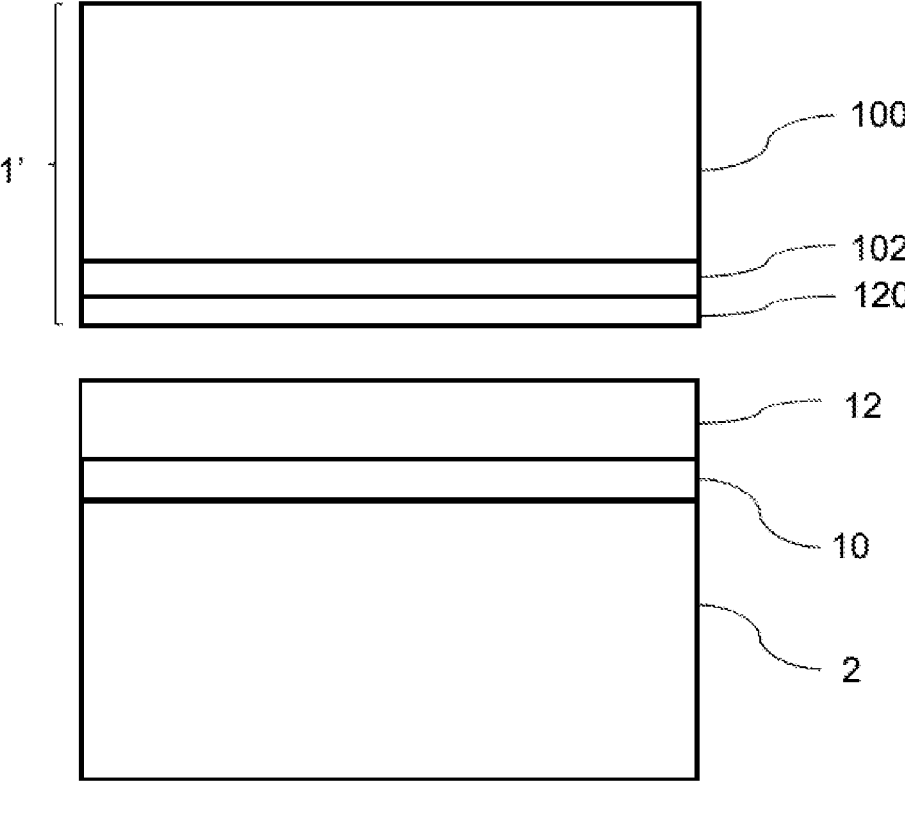
FIG. 7 is a schematic sectional view of the transfer of a thin layer from the donor substrate to the carrier substrate.

With reference to FIG. 7, the donor substrate 1 is detached along the weakened area 11. In a manner known per se, the detachment may be caused by applying a mechanical stress close to the weakened area, by a thermal treatment or by any other appropriate means.

At the end of this detachment, the thin layer 12 has been transferred from the donor substrate to the carrier substrate, and an FDSOI structure is obtained that comprises the carrier substrate 2, the electrically insulating bonding layer 10 and the transferred layer 12.

The structure is then subjected to a finishing treatment conventionally implemented for FDSOI substrates. This finishing treatment includes, in particular, thermal smoothing of the transferred layer ("batch anneal") as mentioned in the introduction.

In some embodiments, this smoothing process involves placing a batch of FDSOI structures in a furnace, slowly increasing the temperature from ambient temperature (20° C.) up to a temperature of the order of 1500 to 1200° C., and then in keeping the structures at this temperature for a duration of several minutes, preferably greater than 15 minutes.

Although the thermal budget of this smoothing process is high enough to allow the dopants present in the structure to diffuse, the dopants in the seed structure have been kept far enough away from the bonding interface by the epitaxial layer 101 and the electrically insulating layer 10 (which do not contain any such dopants) so as not to diffuse into the carrier substrate 2. The electrical resistivity of the carrier substrate is therefore not affected, even in its portion close to the bonding interface.

The FDSOI structure thus formed is therefore fully functional for radiofrequency applications, in particular, in the mmWave band.

Moreover, at the end of the detachment, after the detachment, the remainder 1' of the donor substrate may be recycled in order to allow the formation of a new donor substrate able to be used for a new transfer layer. As illustrated in FIG. 7, the remainder 1' of the donor substrate comprises the seed substrate 100, the intermediate layer 102 (if this is present) and the portion 120 of the epitaxial layer 101 that has not been transferred to the carrier substrate.

Figure 8:
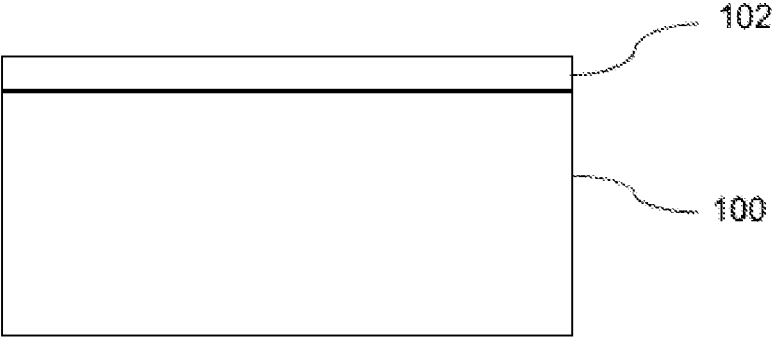
FIG. 8 is a schematic sectional view of a first step of recycling the remainder of the donor substrate resulting from the transfer of FIG. 7.

With reference to FIG. 8, a first step of the recycling comprises selectively etching the portion 120 not transferred from the epitaxial layer 101 with respect to the intermediate layer 102. For this reason, wet etching may be implemented by way of an appropriate etching solution.

Figure 9:
FIG. 9 is a schematic sectional view of a second step of recycling the remainder of the donor substrate.

With reference to FIG. 9, a second step of the recycling comprises selectively etching the intermediate layer 102 with respect to the seed substrate 100. For this reason, wet etching may be implemented by way of an appropriate etching solution.

Figure 10:
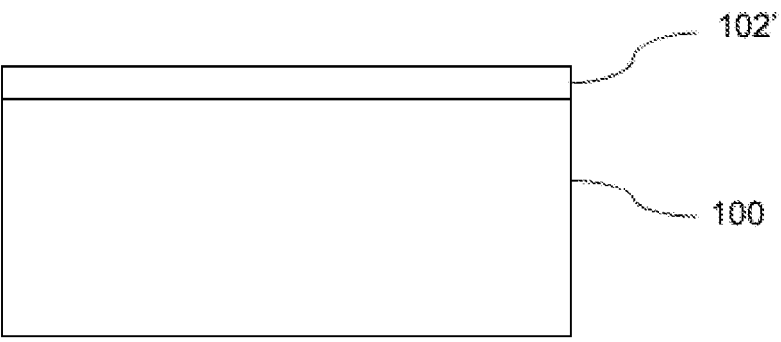
FIG. 10 is a schematic sectional view of the growth of a new intermediate layer on the seed substrate resulting from the recycling.
Figure 11:
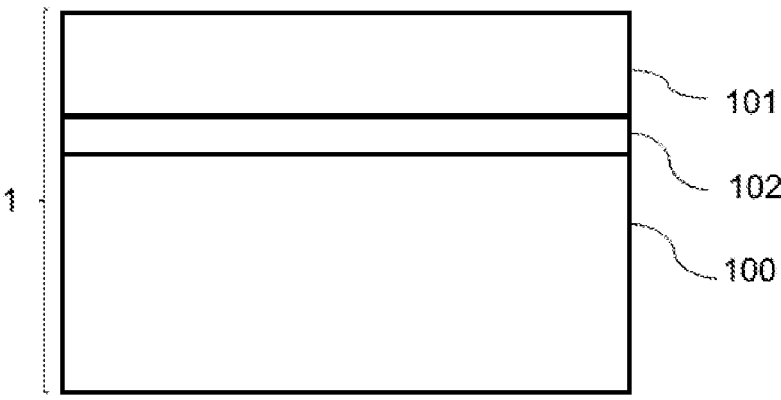
FIG. 11 is a schematic sectional view of the epitaxial growth of a new undoped semiconductor layer on the intermediate layer of FIG. 10.

Next, it is possible to form a new donor substrate by forming, in succession on the seed substrate 100, a new intermediate layer 102' (cf. FIG. 10) and a new undoped epitaxial layer 101' (cf. FIG. 11).

This recycling process is advantageous in comparison with recycling a donor substrate comprising the epitaxial layer directly on the seed substrate.

Specifically, in the case of a donor substrate in which the epitaxial layer is formed directly on the seed substrate, it is not possible to selectively etch the portion not transferred from the epitaxial layer with respect to the seed substrate in that the materials of the seed substrate and of the epitaxial layer have similar compositions that differ, for example, only in terms of their doping level. In this case, recycling the remainder of the donor substrate requires polishing the two faces of the remainder of the donor substrate using a chemical-mechanical polishing (CMP) process, so as to remove all of the portion not transferred from the epitaxial layer, followed by cleaning of the surfaces of the seed substrate, before growing a new epitaxial layer. Each recycling sequence therefore consumes a portion of the thickness of the seed substrate, thereby limiting the number of possible uses of the substrate.

By contrast, when the donor substrate comprises the intermediate layer, which performs the function of an etch stop layer, between the seed substrate and the epitaxial layer, the recycling process may simply be based on etching steps that do not consume the material of the seed substrate. The seed substrate may thus be reused in an unlimited manner, thereby reducing the cost of obtaining the donor substrate.

The invention claimed is:

1. A method for fabricating a semiconductor-on-insulator substrate for radiofrequency applications, comprising:
   forming a donor substrate through epitaxial growth of an undoped semiconductor layer on a p-doped semiconductor seed substrate;
   forming an electrically insulating layer on the epitaxial undoped semiconductor layer;
   implanting ion species through the electrically insulating layer so as to form, in the undoped epitaxial semiconductor layer, a weakened area defining a semiconductor thin layer to be transferred;
   providing a semiconductor carrier substrate having an electrical resistivity greater than or equal to 500 Ω·cm;
   bonding the donor substrate to the carrier substrate via the electrically insulating layer;
   detaching the donor substrate along the weakened area so as to transfer the semiconductor thin layer from the donor substrate to the carrier substrate; and
   forming a radiofrequency device using the semiconductor-on-insulator substrate.

2. The method of claim 1, wherein the epitaxial undoped semiconductor layer has a thickness between 10 and 1000 nm.

3. The method of claim 2, wherein the seed substrate is boron-doped.

4. The method of claim 3, wherein forming the electrically insulating layer comprises thermally oxidizing the material of the epitaxial undoped semiconductor layer.

5. The method of claim 4, wherein forming the donor substrate comprises forming, between the seed substrate and the epitaxial undoped semiconductor layer, an intermediate layer comprising a material different from the material of the epitaxial undoped semiconductor layer, chosen so as to allow selective etching of the epitaxial undoped semiconductor layer with respect to the intermediate layer.

6. The method of claim 5, wherein the material of the undoped semiconductor layer is silicon and the material of the intermediate layer is silicon-germanium with a germanium content less than or equal to 30%.

7. The method of claim 5, further comprising, after the detachment, selectively etching a remainder of the epitaxial undoped semiconductor layer with respect to the intermediate layer and then selectively etching the intermediate layer with respect to the seed substrate, and forming a new donor substrate by successively forming, on the seed substrate, a new intermediate layer and a new epitaxial undoped semiconductor layer.

8. The method of claim 7, wherein the electrically insulating layer has a thickness between 10 and 150 nm.

9. The method of claim 8, wherein the transferred semiconductor layer has a thickness between 4 and 300 nm.

10. The method of claim 1, wherein the seed substrate is boron-doped.

11. The method of claim 1, wherein forming the electrically insulating layer comprises thermally oxidizing the material of the epitaxial undoped semiconductor layer.

12. The method of claim 1, wherein forming the donor substrate comprises forming, between the seed substrate and the epitaxial undoped semiconductor layer, an intermediate layer comprising a material different from the material of the epitaxial undoped semiconductor layer, chosen so as to allow selective etching of the epitaxial undoped semiconductor layer with respect to the intermediate layer.

13. The method of claim 12, wherein the material of the epitaxial undoped semiconductor layer is silicon and the material of the intermediate layer is silicon-germanium with a germanium content less than or equal to 30%.

14. The method of claim 1, wherein the electrically insulating layer has a thickness between 10 and 150 nm.

15. The method of claim 1, wherein the transferred semiconductor layer has a thickness between 4 and 300 nm.

\* \* \* \* \*